(12) United States Patent
Everts

(10) Patent No.: US 11,916,474 B2
(45) Date of Patent: Feb. 27, 2024

(54) ELECTRICAL POWER CONVERTER

(71) Applicant: PRODRIVE TECHNOLOGIES INNOVATION SERVICES B.V., Son (NL)

(72) Inventor: Jordi Everts, Son (NL)

(73) Assignee: PRODRIVE TECHNOLOGIES INNOVATION SERVICES B.V., Son (NL)

( * ) Notice: Subject to any disclaimer, the term of this patent is extended or adjusted under 35 U.S.C. 154(b) by 469 days.

(21) Appl. No.: 17/268,773

(22) PCT Filed: Aug. 14, 2019

(86) PCT No.: PCT/EP2019/071812
§ 371 (c)(1),
(2) Date: Feb. 16, 2021

(87) PCT Pub. No.: WO2020/035527
PCT Pub. Date: Feb. 20, 2020

(65) Prior Publication Data
US 2021/0359595 A1 Nov. 18, 2021

(30) Foreign Application Priority Data
Aug. 17, 2018 (NL) .................................. 2021479

(51) Int. Cl.
*H02M 1/42* (2007.01)
*B60L 53/12* (2019.01)
(Continued)

(52) U.S. Cl.
CPC ........... *H02M 1/4233* (2013.01); *B60L 53/12* (2019.02); *B60L 53/20* (2019.02);
(Continued)

(58) Field of Classification Search
CPC .... H02M 1/4233; H02M 7/219; H02M 7/487; H02M 1/4216; B60L 53/12; B60L 53/20;
(Continued)

(56) References Cited

U.S. PATENT DOCUMENTS 6,026,006 A * 2/2000 Jiang ................... H02M 1/4258
363/46
10,263,558 B2 * 4/2019 Ahmed ............... H02M 5/4585
(Continued)

OTHER PUBLICATIONS

International Search Report and Written Opinion of the International Searching Authority from the European Patent Office, in PCT/EP2019/071812 dated Oct. 21, 2019, which is an international application corresponding to this U.S. application.
(Continued)

*Primary Examiner* — G. M. A Hyder
(74) *Attorney, Agent, or Firm* — Kolitch Romano Dascenzo Gates LLC

(57) ABSTRACT

Electrical converters of the present disclosure feature a boost circuit that is fully integrated with a three phase bridge rectifier to allow for obtaining a pulsed voltage at the rectifier output. Actively switchable semiconductor switches of the boost circuit are controlled by pulse width modulation (PWM) control signals to obtain the pulsed voltage. PWM of this pulsed voltage allows control of two out of three currents at the three input terminals of the rectifier, i.e., the currents at the phase inputs having the highest and the lowest voltage levels of the three phase input voltage.

19 Claims, 11 Drawing Sheets

(51) Int. Cl.
    *B60L 53/20*     (2019.01)
    *G01R 33/385*    (2006.01)
    *H02J 7/02*      (2016.01)
    *H02M 7/219*     (2006.01)

(52) U.S. Cl.
    CPC ............ *G01R 33/3852* (2013.01); *H02J 7/02* (2013.01); *H02M 7/219* (2013.01); *H02J 2207/20* (2020.01)

(58) Field of Classification Search
    CPC .... G01R 33/3852; H02J 7/02; H02J 2207/20; Y02B 70/10; Y02T 10/70; Y02T 10/7072; Y02T 10/92; Y02T 90/14
    See application file for complete search history.

(56) References Cited

U.S. PATENT DOCUMENTS

| | | | |
|---|---|---|---|
| 11,387,730 B2 * | 7/2022 | Everts | H02M 1/4208 |
| 2002/0181258 A1 | 12/2002 | Welches | |
| 2009/0040800 A1 * | 2/2009 | Sonnaillon | H02M 7/1626 |
| | | | 363/127 |
| 2013/0194838 A1 | 8/2013 | Jang | |
| 2017/0016655 A1 | 1/2017 | Shinomoto et al. | |

OTHER PUBLICATIONS

Friedli, T., et al.; "The Essence of Three-Phase PFC Rectifier Systems—Part II," IEEE Transactions on Power Electronics, vol. 29, No. 2, pp. 543-560, Feb. 2014.

\* cited by examiner

ELECTRICAL POWER CONVERTER

TECHNICAL FIELD

The present disclosure relates to the field of electrical power conversion. In particular, the present disclosure relates to an electrical converter and a method for controlling the electrical converter.

INTRODUCTION

For example, when the battery of an electric vehicle is charged, the AC voltage from an electrical grid is converted by an electrical converter into a DC voltage which is then provided to the battery that is being charged. For example, an electrical converter may convert a three-phase AC voltage into a DC voltage between the terminals of a DC bus to which the high-voltage (e.g. 800 V) battery of the vehicle may be connected. Also wireless charging systems for electric cars, or gradient amplifiers for Magnetic Resonance Imaging (MRI) scanners typically need such three-phase AC-to-DC conversion to create a high-voltage DC bus from which power can be drawn.

Usually the current that is drawn by the electrical converter from each phase of the three-phase grid, for example when a load draws power from the DC output of the electrical converter, needs to be substantially sinusoidal and substantially in phase with the sinusoidal voltage of that particular phase, resulting in a power factor that is substantially equal to one. Therefore, the three-phase AC-to-DC conversion advantageously requires a three-phase Power Factor Correcting (PFC) electrical AC-to-DC converter. Also low distortion, for example a low Total Harmonic Distortion (THD), of the grid current is typically required for such PFC converters.

In some applications, such as for example the charging of electric vehicles, it is often a requirement that the amplitude of the sinusoidal current drawn from each phase of the three-phase grid can be independently controlled in order to be able to decrease the loading of a certain phase such that other consumer devices are still able to draw power from that particular phase during the charging of the vehicle's battery while not overloading the phase. In this case, it is advantageous that the three-phase AC-to-DC converter has a terminal for connecting the neutral conductor of the three-phase grid, such that a return current substantially equal to the sum of the three phase currents can flow back to the neutral conductor of the grid, which requires that the AC-to-DC converter is able to inject a current in this neutral connection terminal.

Typically, when the voltage between the DC bus terminals is higher than the full-wave rectified AC voltage, boost-type electrical converters are used, comprising a boost-type PFC stage with a 700-800 V DC output.

For example, in T. Friedli, M. Hartmann, J. W. Kolar, "The Essence of Three-Phase PFC Rectifier Systems—Part II," IEEE Transactions on Power Electronics, vol. 29, no. 2, pp. 543-560, February 2014, electrical converters are shown which are used for three-phase AC to high voltage DC conversion. For example, the six-switch boost-type PFC rectifier or the VIENNA rectifier are conventionally used for this purpose.

SUMMARY

It is an objective of the present disclosure to provide a low cost electrical converter for three-phase boost-type PFC AC-to-DC conversion that has one or more of the following advantages:

it is simple to design,
it generates low current distortions at its input,
it is able to draw independently controlled, substantially sinusoidal currents at its inputs, at a power factor that is substantially equal to one, and
it has a terminal for connecting the neutral conductor of the three-phase AC grid in which a return current can be injected that is substantially equal to the sum of the three phase currents.

According to a first aspect of the present disclosure, there is therefore provided an electrical converter for converting a three-phase AC input into a DC output. An electrical converter according to aspects of the present disclosure comprises: (i) three phase input terminals and two output terminals, (ii) a three phase bridge rectifier having an input connected to the phase input terminals and an output connected to an upper intermediate node and a lower intermediate node, the three phase rectifier comprising first semiconductor switches, (iii) a boost circuit comprising boost inductors, at least one second semiconductor switch that is actively switchable and at least one third semiconductor switch, wherein the at least one second semiconductor switch and the at least one third semiconductor switch are connected in series across the output terminals, (iv) an output filter comprising a filter capacitor connected between the boost circuit and the output terminals, and (v) a controller operably connected to the at least one second semiconductor switch. The boost inductors are connected between the phase terminals and the three phase bridge rectifier. The at least one second semiconductor switch is connected across the upper intermediate node and the lower intermediate node. The controller is configured to control the at least one second semiconductor switch via pulse width modulation allowing for obtaining a pulsed intermediate voltage between the upper intermediate node and the lower intermediate node having a modulated pulse width. The first semiconductor switches are actively switchable and the controller is operably connected to the first semiconductor switches. Advantageously, the controller is configured to control switching of the first semiconductor switches according to a switching pattern wherein the phase input terminal having an intermediate voltage between a highest voltage and a lowest voltage is alternatingly connected to the upper intermediate output node and the lower intermediate output node. Alternatively, or in addition, advantageously, the controller is configured to control switching of the first semiconductor switches according to a switching pattern in which the phase input terminal having a highest voltage is advantageously continuously connected to the upper intermediate output node, and the phase input terminal having a lowest voltage is advantageously continuously connected to the lower intermediate output node.

Electrical converters according to aspects of the present disclosure feature a boost circuit that is fully integrated with a three phase bridge rectifier to allow for obtaining a pulsed voltage at the rectifier output. Actively switchable semiconductor switches of the boost circuit are controlled by pulse width modulation control signals to obtain the pulsed voltage. Pulse Width Modulation (PWM) of this pulsed voltage, which is advantageously a square wave switched between 0 V and an upper voltage, allows to control two out of three currents at the three input terminals of the rectifier, i.e., the currents at the phase inputs having the highest and the lowest voltage levels of the three phase input voltage. To this end, the respective bridge legs of the rectifier that are connected to these phases are advantageously in a selection state. The current at the remaining phase input, having an intermediate voltage level between the highest and the lowest voltage levels of the three phase input voltage, is advantageously controlled by PWM modulation of the remaining bridge leg of the rectifier. This bridge leg is therefore in an active switching state instead of in a selection state. To this end, the boost circuit is provided as a distributed system without capacitive energy storage elements between the rectifier and the boost circuit and with magnetic energy storage elements advantageously located away from the rectifier output in order to fully exploit the pulsed voltage for current control. In particular, the boost inductors, are located between the input terminals and the rectifier bridge and, to this end, they are shared between both the boost circuit and the rectifier.

In one aspect, a current control loop is provided that generates appropriate pulse width modulated control signals that control semiconductor switches of the bridge rectifier and the boost circuit in order to control the current in each boost inductor or phase input. Advantageously, the pulse width modulated control signals that control semiconductor switches of the bridge rectifier and the boost circuit are interleaved in order to reduce input current distortions.

The electrical converter design according to aspects of the present disclosure therefore allows for controlling the current in the converter in an easy way with low input current distortion and with less hardware, in particular less energy storage elements, compared to prior art electrical converters. Moreover, switching losses are reduced since only one out of three bridge legs of the rectifier are in an active switching state, resulting in an improved efficiency of the system.

In an advantageous aspect, the three phase currents can be fully independently controlled by providing a common node connected to a neutral conductor of the input. The boost circuit is advantageously split into two stacked boost circuits. As a result, a PWM modulated three-level square wave voltage is advantageously obtained between the rectifier output nodes. Advantageously, the pulse width modulated control signals that control semiconductor switches of the stacked boost circuits are interleaved in order to reduce the input current distortions.

According to an advantageous aspect, the electrical converter is operable to converting a three-phase AC input voltage provided by an AC grid at three phase inputs into a DC output voltage at the two output terminals of the electrical converter. The DC output voltage can be provided to a load in order to supply power to the load. The electrical converter can comprise one or more of: an input filter, an input power stage, an output power stage, an output filter and a controller. The electrical converter can comprise a connection terminal N for connecting the neutral conductor of the three-phase AC grid.

The input filter advantageously comprises grid-interfacing boost inductors connected to the phase inputs, and advantageously comprises AC filter capacitors interconnecting the phase inputs, such as in the form of a star connection. The star point of the star connection can be connected to connection terminal N.

The input power stage is in the form of a three-phase active rectifier consisting of three bridge legs whose midpoints are respectively connected to each of the three phase inputs via the boost inductors. Each bridge leg is advantageously a two-level half bridge that comprises two controllable semiconductor switches. The controller is advantageously configured to control the semiconductor switches in a way to connect the phase input with the highest voltage to an upper intermediate voltage node via a corresponding one of the boost inductors, to connect the phase input with the lowest voltage to a lower intermediate voltage node via a corresponding one of the boost inductors, and to alternatingly connect, such as via pulse width modulation, the phase input having an intermediate voltage between the highest voltage and the lowest voltage to the upper intermediate voltage node and the lower intermediate voltage node via a corresponding one of the boost inductors. The alternating connection of the phase input having an intermediate voltage between the highest voltage and the lowest voltage is advantageously achieved by PWM modulation of the controllable semiconductor switches of the bridge leg connected to the phase input having the intermediate voltage between the highest voltage and the lowest voltage.

The output filter advantageously comprises a filter capacitor. Advantageously, it can comprise an upper output filter capacitor and a lower output filter capacitor which are connected in series between the output terminals of the electrical converter.

The output power stage comprises a boost circuit, such as a boost converter. The boost circuit can be connected in parallel with the output filter capacitor. Advantageously, the boost circuit comprises an upper boost bridge and a lower boost bridge connected to each other via a common node. The upper boost bridge can be connected in parallel with the upper output filter capacitor, and the lower boost bridge can be connected in parallel with the lower output filter capacitor. The common node is advantageously connected to the connection terminal N. A midpoint of the upper boost bridge can be connected to the upper intermediate voltage node and a midpoint of the lower boost bridge can be connected to the lower intermediate voltage node. The boost circuit and any of the upper and lower boost bridges advantageously comprise at least one second controllable semiconductor switch which is controlled by the controller using PWM modulation. By way of example, PWM modulation of the second semiconductor switches can allow for intermittently connecting the upper and lower intermediate voltage nodes to each other. In another example, PWM modulation of the second semiconductor switch can allow for alternatingly connecting the upper intermediate voltage node to the output terminal and to the common node, and alternatingly connecting the lower intermediate voltage node to the output terminal and to the common node of the electrical converter.

Advantageously, the bridge leg of the three-phase active rectifier, to which the phase input having the intermediate voltage between the highest voltage and the lowest voltage is applied, is operated using PWM modulation in order to control the current drawn from the phase input having the intermediate voltage. The upper boost leg is advantageously operated using PWM modulation in order to control the current drawn from the phase input having the highest voltage. The lower boost leg is advantageously operated using PWM modulation in order to control the current drawn from the phase input having the lowest voltage.

Advantageously, the electrical converter comprises means for measuring the three-phase AC input voltage, the inductor currents, and the DC output voltage coupled to the controller. The controller is advantageously configured to generate (PWM) control signals for the semiconductor switches of the electrical converter (e.g. of the rectifier and/or the boost circuit) based on these measurements and possibly based on provided set-values.

According to a second aspect of the present disclosure, there is provided a wireless charging system, or a magnetic resonance imaging apparatus comprising the electrical converter of the first aspect.

According to a third aspect, there is provided a method of converting a three phase AC input into a DC output as set out in the appended claims. The method is advantageously implemented in the electrical converter as set out above. A method of converting a three phase AC input into a DC output in an electrical boost converter, comprises a step of rectifying the three phase AC input to obtain a rectified intermediate signal across an upper intermediate node and a lower intermediate node and a step of boosting the rectified intermediate voltage to obtain the DC output across an output filter comprising a filter capacitor. The boosting step comprises controlled switching of the rectified intermediate voltage signal by pulse width modulation to obtain a pulsed voltage signal which is applied across the output filter. Boost energy is stored in boost inductors connected to the three phase AC input, advantageously prior to rectifying. Advantageously, in the rectifying step, a phase of the three phase AC input having an intermediate voltage between a highest voltage and a lowest voltage of the three phase AC input is alternatingly applied to the upper intermediate output node and the lower intermediate output node. The rectifying step can comprise measuring the three phase input. Advantageously, the rectifying step comprises determining a first phase having a highest voltage, a second phase having a lowest voltage, and a third phase having the intermediate voltage between the highest voltage and the lowest voltage. The first phase is advantageously continuously applied to the upper intermediate output node. The second phase is advantageously continuously applied to the lower intermediate output node.

An aspect of the present disclosure relates to an electrical converter, that, for example may be used for converting a three-phase AC voltage from an electrical grid, which may be a low voltage (e.g. 380-400 Vrms at 50 Hz frequency) grid, into a high DC output voltage (e.g. 800 V).

BRIEF DESCRIPTION OF THE DRAWINGS

Aspects of the present disclosure will now be described in more detail with reference to the appended drawings, wherein same reference numerals illustrate same features and wherein.

DETAILED DESCRIPTION

Figure 1:
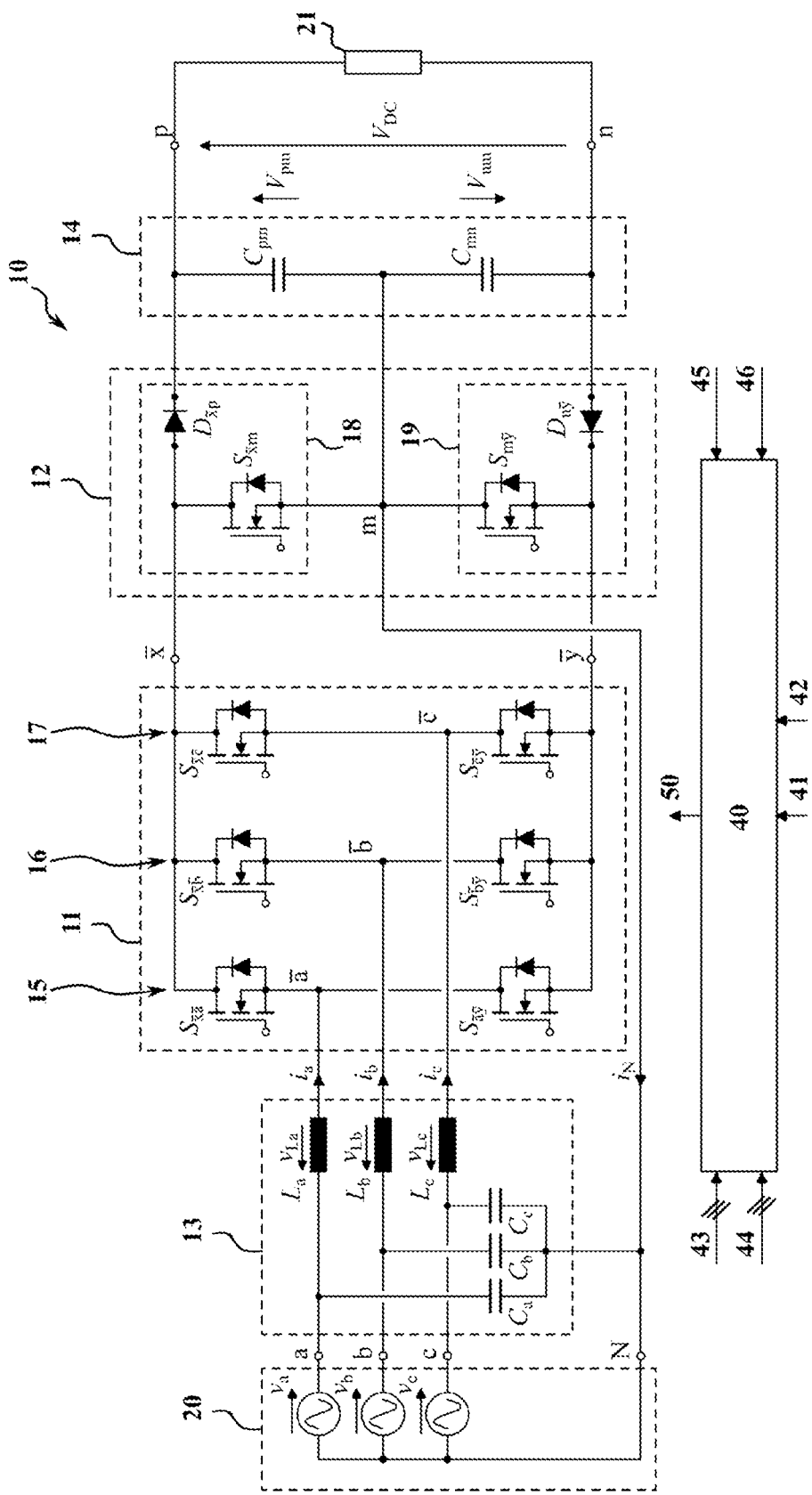
FIG. 1 schematically shows an electrical converter that has a neutral connection terminal and that is unidirectional according to an embodiment of the present disclosure.

FIG. 1 shows an electrical converter 10, referred to as the BELGIAN RECTIFIER, comprising two power stages 11, 12 in the form of a three-phase active rectifier stage 11 and an output power stage 12. Electrical converter 10 further comprises an input filter 13, and an output filter 14.

The electrical converter 10 is an AC-to-DC converter that has three phase inputs a, b, c which are connected to a three-phase voltage of a three-phase AC grid 20, two DC outputs p, n which for example may be connected to a DC load 21 such as, for example, a high voltage (e.g. 800 V)

battery of an electric car, and a terminal N for connecting the neutral conductor of the AC grid 20.

The two power stages 11, 12 may be seen as one 'integrated' conversion stage since no high-frequency filter capacitors are present between the two power stages and since both stages use common energy storage inductors (boost inductors). In particular, the phase inductors $L_a$, $L_b$, $L_c$ of the input filter 13 are used as boost inductors and are shared between both power stages 11, 12.

The rectifier stage 11 has three phase inputs $\bar{a}, \bar{b}, \bar{c}$ that are connected to the three phase inputs a, b, c via the phase inductors $L_a$, $L_b$, $L_c$ of the input filter 13, and two outputs $\bar{x}$, $\bar{y}$. These outputs may be seen as an upper intermediate voltage node $\bar{x}$, and a lower intermediate voltage node $\bar{y}$, which show a 'switched' voltage potential caused by the switching of the output power stage 12.

The rectifier stage 11 consists of three bridge legs 15, 16, 17 which each comprise two actively switchable semiconductor devices ($S_{\bar{x}a}$, and $S_{\bar{a}y}$ for leg 15, $S_{\bar{x}b}$ and $S_{\bar{b}y}$ for leg 16, $S_{\bar{x}c}$ and $S_{\bar{c}y}$ for leg 17) connected in the form of a half bridge configuration. Each switchable semiconductor device has an anti-parallel diode. In this example, Metal Oxide Field Effect Transistors (MOSFETs) are used for the actively switchable semiconductor devices, which each contain an internal anti-parallel body diode that may replace an external anti-parallel diode.

The output power stage consists of two stacked boost bridges 18, 19. Each boost bridge comprises a boost switch ($S_{\bar{x}m}$ for the upper boost bridge 18 and $S_{m\bar{y}}$ for the lower boost bridge 19) and boost diode ($D_{\bar{x}p}$ for the upper boost bridge 18 and $D_{n\bar{y}}$ for the lower boost bridge 19) connected in a half-bridge configuration. The middle node of the upper boost bridge 18 is connected to intermediate voltage node $\bar{x}$ and the middle node of the lower boost bridge 19 is connected to intermediate voltage node $\bar{y}$. The common node m of both boost stages 18, 19 is connected to the midpoint of the output filter 14 which comprises two output filter capacitors $C_{pm}$, $C_{mn}$ that are connected in series between the upper output node p and the lower output node n.

The upper boost bridge 18 is connected between the upper output node p and the middle output node m (i.e. in parallel with the upper output filter capacitor $C_{pm}$), and is arranged in a way that the intermediate voltage node $\bar{x}$ can be alternately connected to the middle output node m and the upper output node p by controlling switch $S_{\bar{x}m}$, wherein current can flow from the intermediate voltage node $\bar{x}$ to the upper output node p via the diode $D_{\bar{x}p}$ when the switch $S_{\bar{x}m}$ is opened (not conducting), and current can flow from the intermediate voltage node $\bar{x}$ to the middle output node m (or vice versa) via the switch $S_{\bar{x}m}$ when the switch $S_{\bar{x}m}$ is closed (conducting).

The lower boost bridge 19 is connected between the middle output node m and the lower output node n (i.e. in parallel with the lower output filter capacitor $C_{mn}$), and is arranged in a way that the intermediate voltage node $\bar{y}$ can be alternately connected to the middle output node m and the lower output node n by controlling switch $S_{m\bar{y}}$, wherein current can flow from the lower output node n to the intermediate voltage node $\bar{y}$ via the diode $D_{n\bar{y}}$ when the switch $S_{m\bar{y}}$ is opened (not conducting), and current can flow from the middle output node m to the intermediate voltage node $\bar{y}$ (or vice versa) via the switch $S_{m\bar{y}}$ when the switch $S_{m\bar{y}}$ is closed (conducting).

The boost switches ($S_{\bar{x}m}$, $S_{m\bar{y}}$) of the boost bridges 18, 19 are actively switchable semiconductor devices. In the example of FIG. 1, MOSFETs are used.

Three AC capacitors $C_a$, $C_b$, $C_c$, which are part of the input filter 13, are interconnecting the phase inputs a, b, c in the form of a star-connection. Generally, it is advantageous that the three capacitors $C_a$, $C_b$, $C_c$ have substantially equal value in order to symmetrically load the AC grid.

The neutral conductor of the three-phase AC grid is connected to the neutral connection terminal N of the converter 10. This neutral connection terminal N is further connected to the star-point of the AC capacitors $C_a$, $C_b$, $C_c$ and to the common node m of the stacked boost bridges 18, 19 (and thus also to the midpoint of the output filter 14). This results in a fully symmetrical converter structure.

The bridge leg of the rectifier stage 11 that is connected with the phase input a, b, or c that has the highest voltage of the three-phase AC input voltage is switched in a way that the corresponding phase input a, b, or c is connected to the upper intermediate voltage node $\bar{x}$ via the corresponding phase inductor ($L_a$, $L_b$, or $L_c$). To achieve this, the bridge leg connects the corresponding phase input $\bar{a}$, $\bar{b}$, or $\bar{c}$ with the node $\bar{x}$. As a result, a conventional DC/DC boost converter (upper boost converter) is formed by the AC capacitor ($C_a$, $C_b$, or $C_c$) of the phase that has the highest voltage, the phase inductor ($L_a$, $L_b$, or $L_c$) of the phase that has the highest voltage, the upper boost bridge 18, and the upper output capacitor $C_{pm}$. The input voltage of this upper boost converter is the voltage $v_a$, $v_b$, or $v_c$ of the phase input a, b, or c that has the highest voltage level, and the output voltage of this upper boost converter is the voltage $V_{pm}$ across the upper output capacitor $C_{pm}$, having a voltage value that is substantially equal to half the total DC bus voltage ($V_{pm} \approx V_{DC}/2$). The formed upper boost converter might be operated by PWM modulation of the switch $S_{\bar{x}m}$, at a certain, possibly variable, switching frequency $f_s$ in order to control the current in the phase inductor ($L_a$, $L_b$, or $L_c$) of the phase that has the highest voltage.

The bridge leg of the rectifier stage 11 that is connected with the phase input a, b, or c that has the lowest voltage of the three-phase AC input voltage is switched in a way that the corresponding phase input a, b, or c is connected to the lower intermediate voltage node y via the corresponding phase inductor ($L_a$, $L_b$, or $L_c$). To achieve this, the bridge leg connects the corresponding phase input $\bar{a}$, $\bar{b}$, or $\bar{c}$ with the node $\bar{y}$. As a result, a conventional 'inversed' (negative input voltage and negative output voltage) DC/DC boost converter (lower boost converter) is formed by the AC capacitor ($C_a$, $C_b$, or $C_c$) of the phase that has the lowest voltage, the phase inductor ($L_a$, $L_b$, or $L_c$) of the phase that has the lowest voltage, the lower boost bridge 19, and the lower output capacitor $C_{mn}$. The input voltage of this lower boost converter is the voltage $v_a$, $v_b$, or $v_c$ of the phase input a, b, or c that has the lowest voltage level, and the output voltage of this lower boost converter is the voltage $V_{nm}$ across the lower output capacitor $C_{mn}$, having a voltage value that is substantially equal to minus half the total DC bus voltage ($V_{nm} \approx -V_{DC}/2$). The formed lower boost converter might be operated by PWM modulation of the switch $S_{m\bar{y}}$, at a certain, possibly variable, switching frequency $f_s$ in order to control the current in the phase inductor ($L_a$, $L_b$, or $L_c$) of the phase that has the lowest voltage.

The bridge leg of the rectifier stage 11 that is connected with the phase input a, b, or c that has a voltage between the highest voltage and the lowest voltage of the three-phase AC input voltage is switched in a way that the corresponding phase input a, b, or c is alternately connected to the upper intermediate voltage node $\bar{x}$ and the lower intermediate voltage node $\bar{y}$ via the corresponding phase inductor ($L_a$, $L_b$, or $L_c$). To achieve this, the bridge leg alternately connects the corresponding phase input $\bar{a}$, $\bar{b}$, or $\bar{c}$ with the nodes $\bar{x}$ and $\bar{y}$. The bridge leg of the rectifier stage 11 connected with the phase input a, b, or c that has a voltage between the highest voltage and the lowest voltage of the three-phase AC input voltage may be switched in a similar fashion as a single-phase half-bridge voltage-source converter (VSC), and is operated by PWM modulation of the switches of the bridge leg at a certain, possibly variable, switching frequency $f_s$ in order to control the current in the phase inductor ($L_a$, $L_b$, or $L_c$) of the phase that has a voltage between the highest voltage and the lowest voltage of the three-phase AC input voltage.

In summary is can be said that two out of three bridge legs of the rectifier stage 11 are in a 'selection state', selecting which AC capacitor ($C_a$, $C_b$, or $C_c$) and phase inductor ($L_a$, $L_b$, or $L_c$) are part of the upper boost converter that contains upper boost bridge 18 and upper output capacitor $C_{pm}$, and that is used to control the current in the phase inductor ($L_a$, $L_b$, or $L_c$) of the phase input a, b, or c that has the highest voltage of the three-phase AC input voltage, and which AC capacitor ($C_a$, $C_b$, or $C_c$) and phase inductor ($L_a$, $L_b$, or $L_c$) are part of the lower boost converter that contains lower boost bridge 19 and lower output capacitor $C_{mn}$, and that is used to control the current in the phase inductor ($L_a$, $L_b$, or $L_c$) of the phase input a, b, or c that has the lowest voltage of the three-phase AC input voltage. The remaining bridge leg of the rectifier stage 11 is in an 'active switching state' and may be operated in a similar fashion as a single-phase half-bridge voltage-source converter (VSC). It forms a remaining switching circuit containing the remaining phase inductor ($L_a$, $L_b$, or $L_c$) and the remaining phase capacitor ($C_a$, $C_b$, or $C_c$) of the phase input a, b, or c that has a voltage between the highest voltage and the lowest voltage of the three-phase AC input voltage. The remaining switching circuit also contains the series connection of the two output capacitors $C_{pm}$, $C_{mn}$, and is used to control the current in the phase inductor ($L_a$, $L_b$, or $L_c$) of the phase that has a voltage between the highest voltage and the lowest voltage of the three-phase AC input voltage.

Figure 2A:
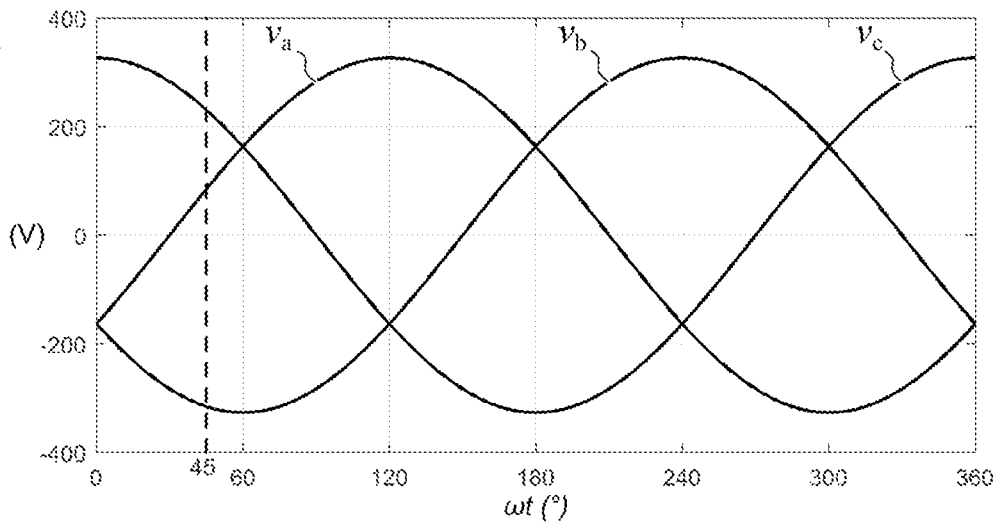
FIG. 2A shows a diagram of voltages during a 360° period of the AC mains voltage, and illustrates the overall operating principle of the electrical converter according to an embodiment of the present disclosure.

In a three-phase AC grid with substantially balanced phase voltages, for example as shown in FIG. 2A, the assignment of the state of the bridge legs of the rectifier stage 11 ('selection state' and 'active switching state'), as well as the assignment of the AC capacitors $C_a$, $C_b$, $C_c$ and phase inductors $L_a$, $L_b$, $L_c$ to the formed upper boost converter, the formed lower boost converter, and the formed remaining switching circuit changes every 60° sector of the three-phase AC input voltage depending on the voltage value of the phase inputs (a, b, c). This results in 6 unique assignments. The sequence of these assignments repeats itself every period (360°) of the AC mains voltage.

Figure 2B:
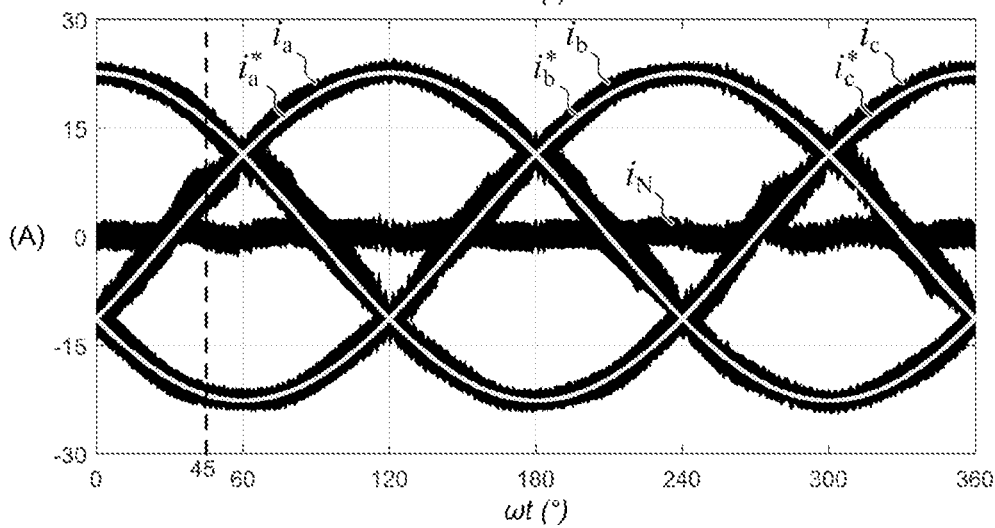
FIG. 2B shows a diagram of currents during a 360° period of the AC mains voltage, and illustrates the overall operating principle of the electrical converter according to an embodiment of the present disclosure.
Figure 2C:
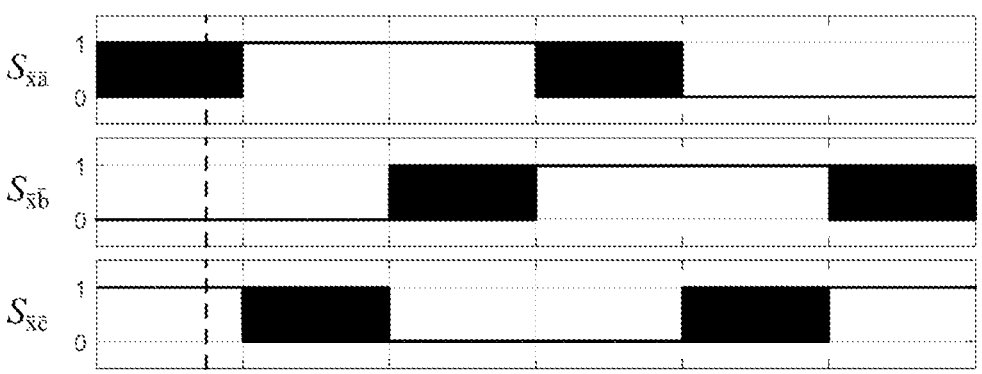
FIG. 2C shows a diagram of switching states of the rectifier switches during a 360° period of the AC mains voltage, and illustrates the overall operating principle of the electrical converter according to an embodiment of the present disclosure.
Figure 2D:
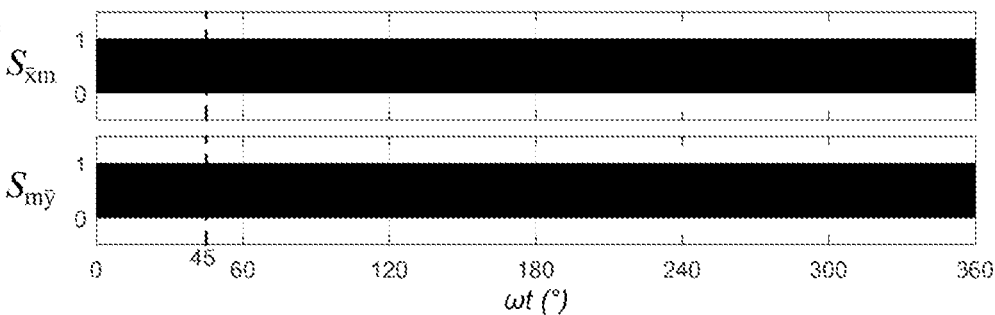
FIG. 2D shows a diagram of switching states of the boost circuit switches during a 360° period of the AC mains voltage, and illustrates the overall operating principle of the electrical converter according to an embodiment of the present disclosure.

TABLE 1 summarizes the states ('selection state' and 'active switching state') of the bridge legs of the rectifier stage 11 during every 60° sector of the period (360°) of the AC mains voltage shown in FIG. 2A. Note that the switches of the bridge leg that is in the 'active switching state' are PMW modulated, as also indicated in TABLE 1 (switch 'PWM modulated'→S=PWM). The switches of the bridge legs that are in the 'selection state' are either 'on' or 'off' during the particular sector, as also indicated in TABLE 1 (switch 'on'→S=1, switch 'off':→S=0). The states of the switches of the rectifier stage 11 during every 60° sector of the period (360°) of the AC mains voltage are visualized in FIG. 2C, wherein only the states of the upper switches ($S_{\bar{x}\bar{a}}$, $S_{\bar{x}\bar{b}}$, $S_{\bar{x}\bar{c}}$) of the rectifier stage 11 are shown whereas the states of the lower switches ($S_{\bar{a}\bar{y}}$, $S_{\bar{b}\bar{y}}$, $S_{\bar{c}\bar{y}}$) are complementary to those of the upper switches. Note that, in FIG. 2C, black-colored bars indicates PWM modulation of the corresponding switch. FIG. 2D shows the state of the switch $S_{\bar{x}m}$ of the upper boost bridge 18 and the state of the switch $S_{n\bar{y}}$ of the lower boost bridge 19, which are both PWM modulated, as can be seen from the black-colored bars. An example of the currents $i_a$, $i_b$, $i_c$ in the phase inductors $L_a$, $L_b$, $L_c$ and the return current $i_N$ is shown in FIG. 2B. In this example the amplitudes of the phase inductor currents $i_a$, $i_b$, $i_c$ are equal and, as a result, the average return current $i_N$ is zero.

In correspondence with TABLE 1, for every 60° sector of the period (360°) of the AC mains voltage shown in FIG. 2A, TABLES 2-4 summarize, inter alia, the assignment of the phase capacitor ($C_a$, $C_b$, or $C_c$) and phase inductors ($L_a$, $L_b$, or $L_c$) to respectively the formed upper boost converter (containing upper boost bridge 18), the formed lower boost converter (containing lower boost bridge 19), and to the formed remaining switching circuit (containing the bridge leg of the rectifier that is in the 'active switching state').

TABLE 1

States of the bridge legs of the rectifier stage 11 and their switches.

| Sector | Bridge leg 15 | Bridge leg 16 | Bridge leg 17 |
|---|---|---|---|
| 0°–60° | Active switching state $S_{\bar{x}\bar{a}}$ & $S_{\bar{a}\bar{y}}$ = PWM | Selection state $S_{\bar{x}\bar{b}}$ = 0, $S_{\bar{b}\bar{y}}$ = 1 | Selection state $S_{\bar{x}\bar{c}}$ = 1, $S_{\bar{c}\bar{y}}$ = 0 |
| 60°–120° | Selection state $S_{\bar{x}\bar{a}}$ = 1, $S_{\bar{a}\bar{y}}$ = 0 | Selection state $S_{\bar{x}\bar{b}}$ = 0, $S_{\bar{b}\bar{y}}$ = 1 | Active switching state (PWM) $S_{\bar{x}\bar{c}}$ & $S_{\bar{c}\bar{y}}$ = PWM |
| 120°–180° | Selection state $S_{\bar{x}\bar{a}}$ = 1, $S_{\bar{a}\bar{y}}$ = 0 | Active switching state (PWM) $S_{\bar{x}\bar{b}}$ & $S_{\bar{b}\bar{y}}$ = PWM | Selection state $S_{\bar{x}\bar{c}}$ = 0, $S_{\bar{c}\bar{y}}$ = 1 |
| 180°–240° | Active switching state (PWM) $S_{\bar{x}\bar{a}}$ & $S_{\bar{a}\bar{y}}$ = PWM | Selection state $S_{\bar{x}\bar{b}}$ = 1, $S_{\bar{b}\bar{y}}$ = 0 | Selection state $S_{\bar{x}\bar{c}}$ = 0, $S_{\bar{c}\bar{y}}$ = 1 |
| 240°–300° | Selection state $S_{\bar{x}\bar{a}}$ = 0, $S_{\bar{a}\bar{y}}$ = 1 | Selection state $S_{\bar{x}\bar{b}}$ = 1, $S_{\bar{b}\bar{y}}$ = 0 | Active switching state (PWM) $S_{\bar{x}\bar{c}}$ & $S_{\bar{c}\bar{y}}$ = PWM |
| 300°–360° | Selection state $S_{\bar{x}\bar{a}}$ = 0, $S_{\bar{a}\bar{y}}$ = 1 | Active switching state (PWM) $S_{\bar{x}\bar{b}}$ & $S_{\bar{b}\bar{y}}$ = PWM | Selection state $S_{\bar{x}\bar{c}}$ = 1, $S_{\bar{c}\bar{y}}$ = 0 |

TABLE 2

Assignment of circuit elements to the formed upper boost converter for every 60° sector of the period (360°) of the AC mains voltage.

| Sector | Involved input inductor | Involved AC capacitor | Involved output capacitor | Involved bridge leg |
|---|---|---|---|---|
| 0°–60° | $L_c$ | $C_c$ | $C_{pm}$ | 18 |
| 60°–120° | $L_a$ | $C_a$ | $C_{pm}$ | 18 |
| 120°–180° | $L_a$ | $C_a$ | $C_{pm}$ | 18 |
| 180°–240° | $L_b$ | $C_b$ | $C_{pm}$ | 18 |
| 240°–300° | $L_b$ | $C_b$ | $C_{pm}$ | 18 |
| 300°–360° | $L_c$ | $C_c$ | $C_{pm}$ | 18 |

TABLE 3

Assignment of circuit elements to the formed lower boost converter for every 60° sector of the period (360°) of the AC mains voltage.

| Sector | Involved input inductor | Involved AC capacitor | Involved output capacitor | Involved bridge leg |
|---|---|---|---|---|
| 0°-60° | $L_b$ | $C_b$ | $C_{mn}$ | 19 |
| 60°-120° | $L_b$ | $C_b$ | $C_{mn}$ | 19 |
| 120°-180° | $L_c$ | $C_c$ | $C_{mn}$ | 19 |
| 180°-240° | $L_c$ | $C_c$ | $C_{mn}$ | 19 |
| 240°-300° | $L_a$ | $C_a$ | $C_{mn}$ | 19 |
| 300°-360° | $L_a$ | $C_a$ | $C_{mn}$ | 19 |

TABLE 4

Assignment of circuit elements to the formed 'remaining switching circuit' for every 60° sector of the period (360°) of the AC mains voltage.

| Sector | Involved input inductor | Involved AC capacitor | Involved output capacitor | Involved bridge leg |
|---|---|---|---|---|
| 0°-60° | $L_a$ | $C_a$ | $C_{pm}$ & $C_{mn}$ | 15 |
| 60°-120° | $L_c$ | $C_c$ | $C_{pm}$ & $C_{mn}$ | 17 |
| 120°-180° | $L_b$ | $C_b$ | $C_{pm}$ & $C_{mn}$ | 16 |
| 180°-240° | $L_a$ | $C_a$ | $C_{pm}$ & $C_{mn}$ | 15 |
| 240°-300° | $L_c$ | $C_c$ | $C_{pm}$ & $C_{mn}$ | 17 |
| 300°-360° | $L_b$ | $C_b$ | $C_{pm}$ & $C_{mn}$ | 16 |

As shown in FIG. 1, a central control unit 40 may be used to control all the controllable semiconductor switches of the electrical converter 10, sending control signals to each switch via a communication interface 50. Furthermore, the control unit has measurement input ports (43, 44, 45, 46), for receiving measurements of:

43: the AC-grid phase voltages $v_a$, $v_b$, $v_c$;
44: the AC inductor currents $i_a$, $i_b$, $i_c$;
45: the DC bus voltage $V_{DC}$;
46: the DC bus mid-point voltage $V_{mn}=-V_{nm}$, and an input port 41 to receive a set-value, which may be a requested DC output voltage $V^*_{DC}$, and a input port 42 to receive set-values for phase-imbalance current control. For example, the set-values for phase-imbalance current control may be values percentages defining for each phase a requested reduction of the maximum amplitude of the phase current, in order to for example unload a particular phase.

Figure 3:
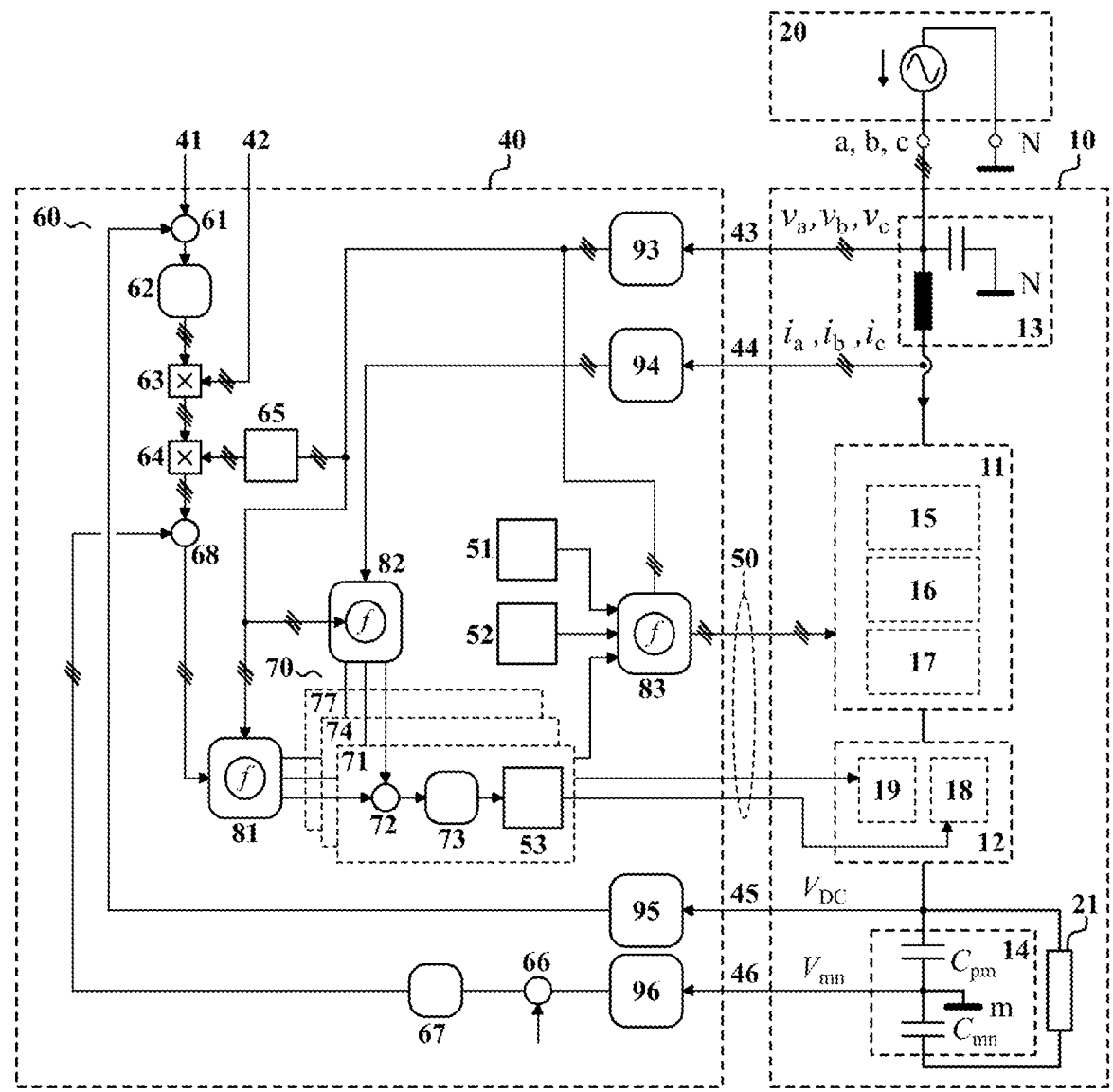
FIG. 3 shows a block diagram of an advantageous implementation of a central control unit and control method according to an embodiment of the present disclosure.

FIG. 3 shows a block diagram of an advantageous implementation of the central control unit 40 which is shown in a schematically way in FIG. 1. The electrical converter 10 is in FIG. 3 represented as a 'single-wire' equivalent circuit, wherein the annotations of the elements correspond with those given in FIG. 1. Three slashes in a signal line indicate the bundling of three phase signals, and may represent the transition to a vector representation.

The goal of the control unit 40 is to control the output voltage $V_{DC}$ to a requested set-value $V^*_{DC}$ that is received from an external unit via input port 41, and to balance the voltage across the two output capacitors $C_{pm}$ and $C_{mn}$, for example by controlling the voltage across the lower output capacitor $C_{mn}$ to be substantially equal to half the DC bus voltage. Additionally, the current drawn from the phase inputs (a,b,c) needs to be shaped substantially sinusoidal and controlled substantially in phase with the corresponding phase voltage. Note that the currents drawn from the phase inputs (a,b,c) is equal to the filtered (low-passed) currents $i_a$, $i_b$, $i_c$ in the phase inductors $L_a$, $L_b$, $L_c$, since the high-frequency ripple of the phase-inductor currents $i_a$, $i_b$, $i_c$ is filtered by the AC capacitors ($C_a$, $C_b$, or $C_c$). Therefore, controlling the currents drawn from the phase inputs (a,b,c) can be done by controlling the, for example low-pass filtered, phase-inductor currents $i_a$, $i_b$, $i_c$.

The control of the output voltage $V_{DC}$ is done using a cascaded control structure, comprising an outer voltage control loop 60 and inner current control loop 70. The set-value of the output voltage is input to a comparator 61 via input port 41, and is compared with the measured output voltage obtained from a measurement processing unit 95 (for example comprising a low-pass filter). The output of comparator 61 is the control-error signal of the output voltage, which is further input to a control element 62 (for example comprising a proportional-integral control block) that outputs the instantaneous set-values of the amplitudes of the phase-inductor currents. These amplitudes are input to multiplier 63, and multiplied with the set-values for phase-imbalance current control which are received via input port 42, in order to unload a particular phase if this would be required. The output of the multiplier 63 are updated instantaneous set-values of the amplitudes of the phase-inductor currents, which are input to multiplier 64, and multiplied with signals that are obtained from calculation element 65 that outputs normalized instantaneous values of the phase voltages. The input of calculation element 65 are the measured phase voltages obtained from a measurement processing unit 93 (for example comprising a low-pass filter). The output of the multiplier 64 are set-values $i^*_a$, $i^*_b$, $i^*_c$ for the instantaneous, for example low-pass filtered, phase-inductor currents $i_a$, $i_b$, $i_c$, and are shaped substantially sinusoidal and positioned substantially in phase with the corresponding phase voltages. The set-values $i^*_a$, $i^*_b$, $i^*_c$ are input to the current controller 70 after passing an addition element 68 and a selection element 81 whose functions are further detailed in the following text.

The current controller 70 is split into three individual current controllers 71, 74, 77, wherein:

individual current controller 71 is used for controlling the current in the phase-inductor of the phase input a,b,c, that has the highest voltage of the three-phase AC voltage. This control is done by PWM modulation of the switch $S_{\overline{x}m}$ of the upper boost converter containing upper boost bridge 18, as explained in the foregoing text;

individual current controller 74 is used for controlling the current in the phase-inductor of the phase input a,b,c, that has the lowest voltage of the three-phase AC voltage. This control is done by PWM modulation of the switch $S_{m\overline{y}}$ of the lower boost converter containing lower boost bridge 19, as explained in the foregoing text;

individual current controller 77 is used for controlling the current in the phase-inductor of the phase input a,b,c, that has a voltage between the highest voltage and the lowest voltage of the three-phase AC voltage. This control is done by the PWM modulation of the switches of the bridge leg of the remaining switching circuit containing the bridge leg of the rectifier that is in the 'active switching state', as explained in the foregoing text.

Selector element 81 is used to send the set-values $i^*_a$, $i^*_b$, $i^*_c$ for the instantaneous phase-inductor currents to the correct individual current controller (71, 74, 77) depending on the voltage value of the phase inputs (a, b, c), wherein:

the set-value of the phase current of the phase input a,b,c, that has the highest voltage of the three-phase AC voltage is sent to individual current controller 71;

the set-value of the phase current of the phase input a,b,c, that has the lowest voltage of the three-phase AC voltage is sent to individual current controller 74;

the set-value of the phase current of the phase input a,b,c, that a voltage between the highest voltage and the lowest voltage of the three-phase AC voltage is sent to individual current controller 77.

In each individual current controller the received set-value for the instantaneous phase-inductor current is input to a comparator, for example comparator 72 of individual current controller 71, and compared with the measured phase-inductor current obtained from a measurement processing unit 94 (for example comprising a low-pass filter) and sent to the comparator of the correct individual current controller by selector element 82 which operates in a similar fashion as selector element 81. The output of the comparator is the control-error signal of the current, which is further input to a control element, for example control element 73 of individual current controller 71, whose output is input to a PWM generation element, for example PWM generation element 53 of individual current controller 71. The PWM generation element of the individual current controllers generate the PWM-modulated control signals for the controllable semiconductor switches of the PWM-controlled bridge legs, i.e. the upper boost bridge 18 of the upper boost converter, the lower boost bridge 19 of the lower boost converter, and the bridge leg of the rectifier 11 that is in the active switching state ('remaining bridge leg'). These PWM-modulated control signals are sent to the appropriate bridges via communication interface 50, wherein:

the PWM-modulated control signal for the switch of the upper boost bridge 18 of the upper boost converter is sent directly from the PWM generation element of the individual current controller 71;

the PWM-modulated control signal for the switch of the lower boost bridge 19 of the lower boost converter is sent directly from the PWM generation element of the individual current controller 74;

the PWM-modulated control signals for the switches of the bridge leg of the rectifier 11 that is in the active switching state ('remaining bridge leg') is sent by selector element 83 which determines which bridge leg of the rectifier 11 is in the active switching state depending on the voltage value of the phase inputs (a, b, c), in a similar fashion as selector elements 81, 82.

The control signals for the switches of the bridge legs of the rectifier stage 11 that are in the 'selection state' are either 'on' or 'off'. These control signals are generated by switch-signal generators 51, 52. The output of both switch-signal generators are complementary, for example switch-signal generator 51 generates control signals that put the top switch of a bridge leg in the on state and the bottom switch of the bridge leg in the off state while switch-signal generator 52 generates control signals that put the bottom switch of a bridge leg in the on state and the top switch of the bridge leg in the off state. Selector element 83 determines to which bridge legs of the rectifier 11 the control signals output by switch-signal generators 51, 52 are sent depending on the voltage value of the phase inputs (a, b, c), in a similar fashion as selector elements 81, 82.

DC bus mid-point balancing is done by adding an offset value to the set-values $i^*_a$, $i^*_b$, $i^*_c$ for the instantaneous, for example low-pass filtered, phase-inductor currents $i_a$, $i_b$, $i_c$, which are output by multiplier 64. The offset value is obtained by comparing the measured DC bus midpoint voltage obtained from a measurement processing unit 96 (for example comprising a low-pass filter) with a set-value (for example $V_{DC}/2$) using comparator 66 and feeding the error signal output by the comparator 66 into a control element 67.

The phase-inductor currents $i_a$, $i_b$, $i_c$ shown in FIG. 2B are obtained by controlling the electrical converter 10 using such control unit 40 and control method detailed in the foregoing text. Also shown in FIG. 2B are the set-values $i^*_a$, $i^*_b$, $i^*_c$ for the instantaneous, for example low-pass filtered, phase-inductor currents $i_a$, $i_b$, $i_c$, as input to selector element 81 shown in FIG. 3.

Figure 4A:
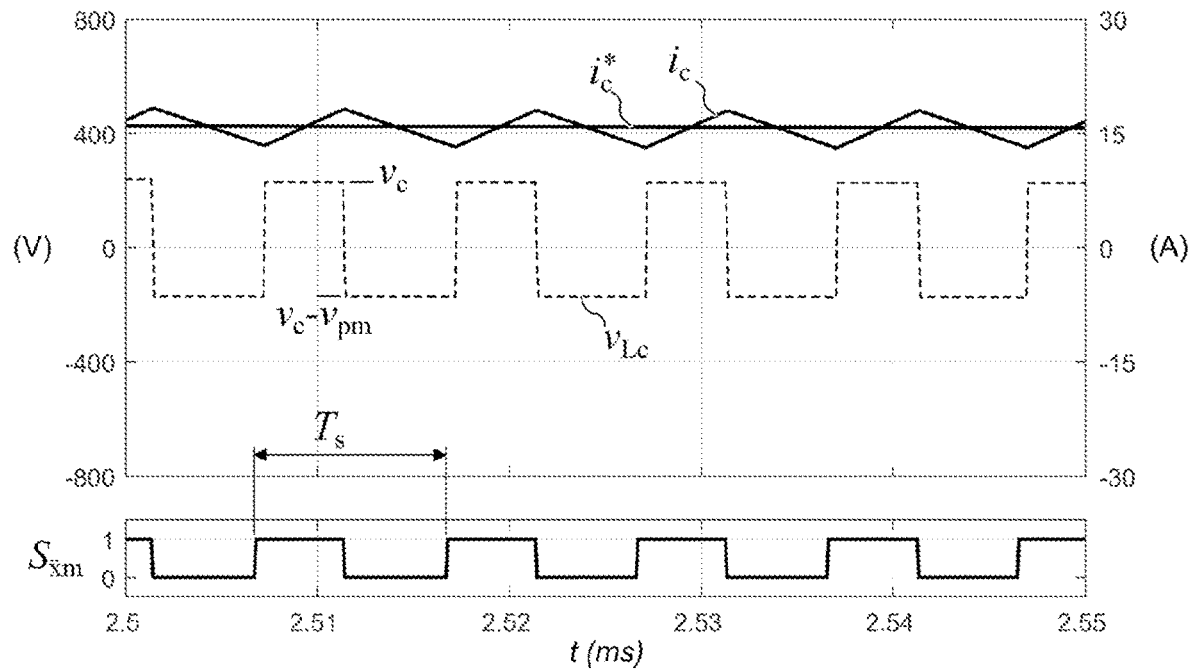
FIG. 4A shows a first diagram with voltages, currents and switching states within five consecutive switching cycles of the bridge legs of the electrical converter, and illustrates the PWM modulation of the bridge legs of the electrical converter according to an embodiment of the present disclosure.
Figure 4B:
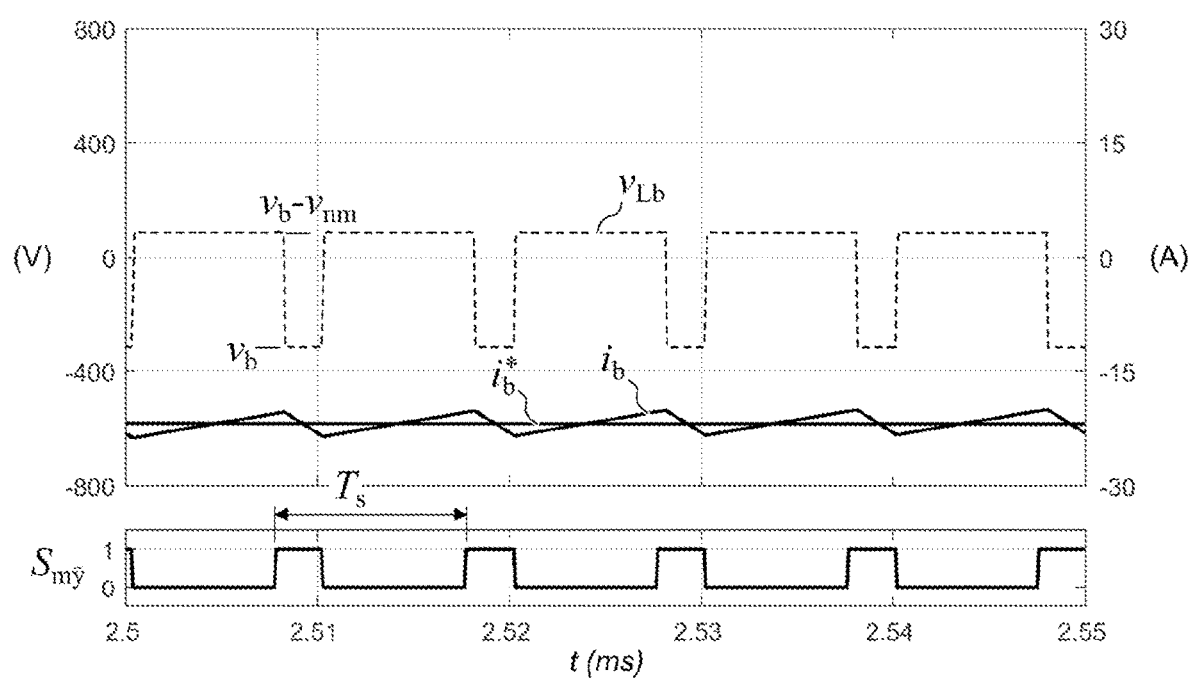
FIG. 4B shows a second diagram with voltages, currents and switching states within five consecutive switching cycles of the bridge legs of the electrical converter, and illustrates the PWM modulation of the bridge legs of the electrical converter according to an embodiment of the present disclosure.
Figure 4C:
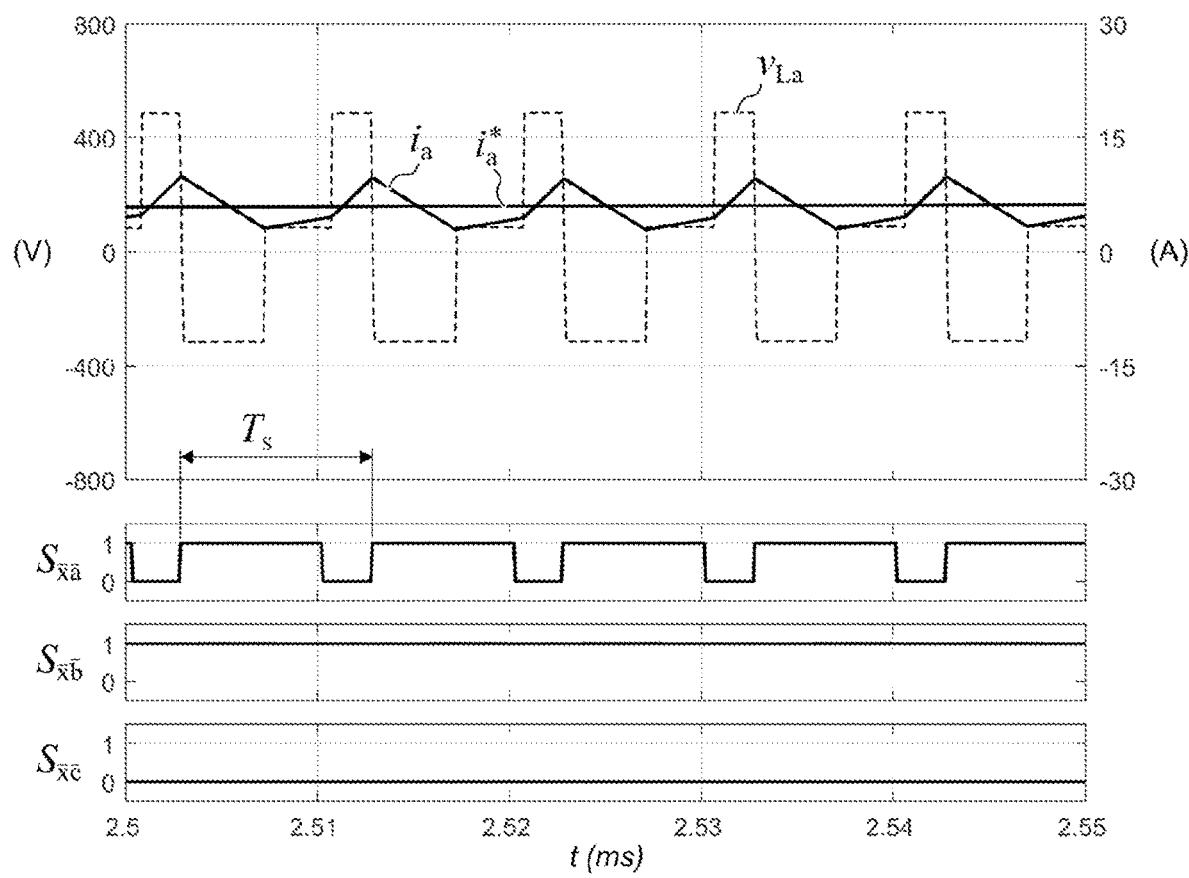
FIG. 4C shows a third diagram with voltages, currents and switching states within five consecutive switching cycles of the bridge legs of the electrical converter, and illustrates the PWM modulation of the bridge legs of the electrical converter according to an embodiment of the present disclosure.

FIGS. 4A-4C show diagrams within five consecutive switching cycles (i.e., each having a switching period Ts equal to 1/fs, with fs the switching frequency) of the bridge legs of the electrical converter 10, for a time interval around ωt=45° which lies within the sector of the three-phase AC input voltage where 0≤ωt<60° (see FIG. 2). Within this sector, the bridge legs of the rectifier stage 11 are in the following switching states:

bridge leg 15: active switching state; $S_{\overline{xa}}$ & $S_{\overline{ay}}$=PWM;

bridge leg 16: selection state; $S_{\overline{xb}}$=0, $S_{\overline{by}}$=1, connecting phase input b with node $\overline{y}$;

bridge leg 17: selection state; $S_{\overline{xc}}$=1, $S_{\overline{cy}}$=0, connecting phase input c with node $\overline{x}$.

Accordingly:

An upper boost converter is formed by the upper boost bridge 18, AC capacitor $C_c$, phase inductor $L_c$, and upper output capacitor $C_{pm}$.

A lower boost converter is formed by the lower boost bridge 19, AC capacitor $C_b$, phase inductor $L_b$, and lower output capacitor $C_{mn}$.

A remaining switching circuit (similar to single-phase half-bridge voltage-source converter (VSC) is formed by PWM-modulated bridge leg 15 of the rectifier stage 11, AC capacitor $C_a$, phase inductor $L_a$, and both output capacitors $C_{pm}$, $C_{ma}$.

The diagrams of FIGS. 4A-4C show voltages, currents, and switching signals on a milliseconds time axis. FIG. 4A corresponds with the operation of the formed upper boost converter, showing the corresponding inductor current $i_c$ (and the set-value $i^*_c$ of this current), the inductor voltage $v_{Lc}$, and the control signal $S_{\overline{xm}}$, of the switch of the PWM-modulated upper boost bridge 18. FIG. 4B corresponds with the operation of the formed lower boost converter, showing the corresponding inductor current $i_b$ (and the set-value $i^*_b$ of this current), the inductor voltage $v_{Lb}$, and the control signal $S_{\overline{my}}$ of the switch of the PWM-modulated lower boost bridge 19. FIG. 4C corresponds with the operation of the formed remaining switching circuit, showing the corresponding inductor current $i_a$ (and the set-value is of this current), the inductor voltage $v_{La}$, and the control signal $S_{\overline{xa}}$ of the upper switch of the PWM-modulated bridge leg 15. Note that the control signal $S_{\overline{ay}}$ of the lower switch of the PWM-modulated bridge leg 15 is the complement of the control signal $S_{\overline{xa}}$. FIG. 4C also shows the control signals $S_{\overline{xb}}$, $S_{\overline{xc}}$ of the upper switches of the bridge legs 16, 17 of the rectifier stage 11 which are in the selection state. Also here, the control signals $S_{\overline{by}}$, $S_{\overline{cy}}$ of the lower switches are the complement of the control signals $S_{\overline{xb}}$, $S_{\overline{xc}}$ of the upper switches.

Figure 5A:
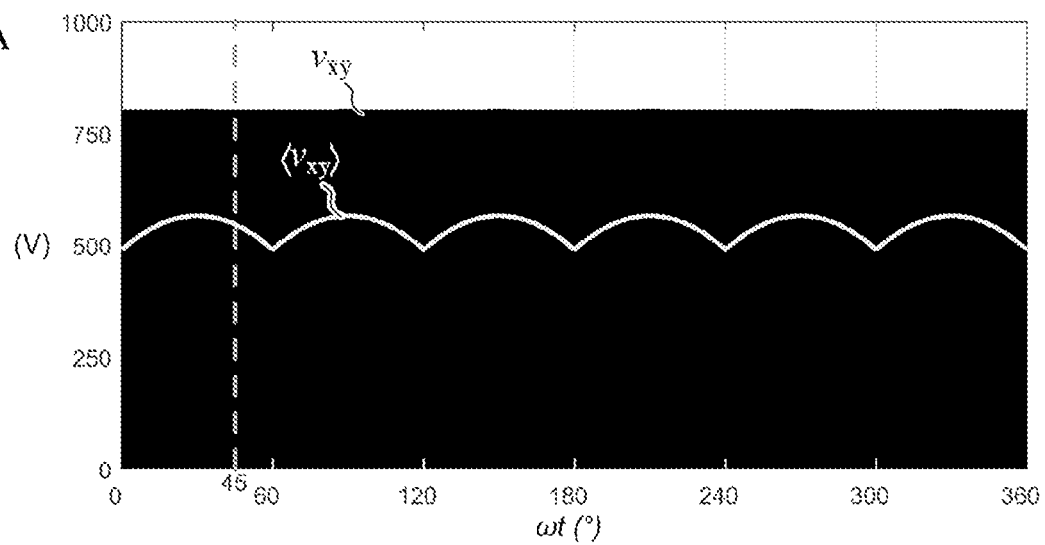
FIG. 5A shows a diagram with voltages of the electrical converter for a 360° period of the AC mains voltage and for five consecutive switching cycles of the bridge legs of the electrical converter, and illustrate the 'switched' nature of the voltage potential of the upper intermediate voltage node $\bar{x}$ and the lower intermediate voltage node $\bar{y}$ of the electrical converter according to an embodiment of the present disclosure.
Figure 5B:
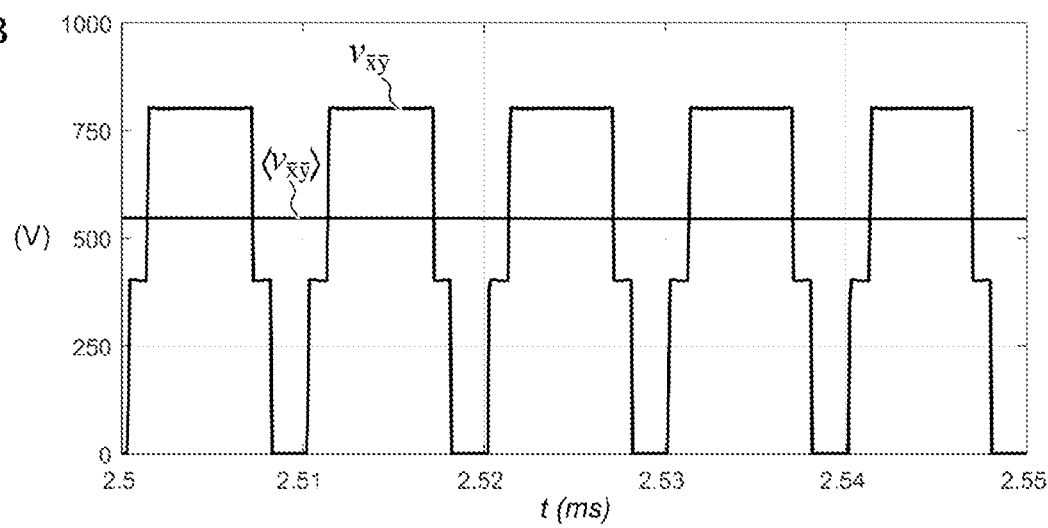
FIG. 5B shows a diagram with currents of the electrical converter for a 360° period of the AC mains voltage and for five consecutive switching cycles of the bridge legs of the electrical converter, and illustrate the 'switched' nature of the voltage potential of the upper intermediate voltage node $\bar{x}$ and the lower intermediate voltage node $\bar{y}$ of the electrical converter according to an embodiment of the present disclosure.

A property of the electrical converter 10 is that the upper intermediate voltage node $\overline{x}$ and the lower intermediate voltage node $\overline{y}$ show a 'switched' voltage potential caused by the switching of the output power stage 12. Therefore, the voltage $v_{\overline{xy}}$ between these two nodes is also a switched voltage, particularly a three-level voltage, as can be seen from FIG. 5A, showing a period (360°) of the AC mains voltage, and from FIG. 5B, showing five consecutive switching cycles for a time interval around ωt=45°. The average value $\langle v_{\overline{xy}} \rangle$ of voltage $v_{\overline{xy}}$, is also shown in FIG. 5A, FIG. 5B and is equal to the full-wave rectified AC voltage.

In order to minimize the Total Harmonic Distortion (THD) of the AC input current of the electrical converter, the high-frequency ripple of inductor currents $i_a$, $i_b$, $i_c$ is advantageously minimized. Particularly, the high-frequency ripple of the current drawn from the phase input (a, b, c) having a voltage between the highest voltage and the lowest voltage may be minimized by proper phase-shifting or interleaving of the PWM switching signals of the controllable semiconductor switches of the upper boost leg, the lower boost leg, and the bridge leg connected to the phase input (a,b,c) having a voltage between the highest voltage and the lowest voltage. Note that the PWM switching signals ($S_{\overline{x}m}$, $S_{m\overline{y}}$, $S_{\overline{xa}}$) shown in respectively FIG. 4A, FIG. 4B, FIG. 4C are interleaved in an exemplary way.

An advantage of the electrical converter 10 is that the ripple of inductor currents $i_a$, $i_b$, $i_c$ is smaller than for a conventional six-switch boost-type PFC rectifier which means that, for the same ripple current, smaller phase inductors can be used. This is the result of the lower voltage integral (i.e. over half a switching cycle) of the inductor voltages and the possibility to interleave the PWM control signals of the controllable semiconductor switches of the upper boost leg 18, the lower boost leg 19, and the bridge leg of the rectifier 11 that is connected to the phase input (a,b,c) having a voltage between the highest voltage and the lowest voltage in order to reduce the high-frequency ripple of the current drawn from the phase input (a, b, c) having a voltage between the highest voltage and the lowest voltage.

Figure 6:
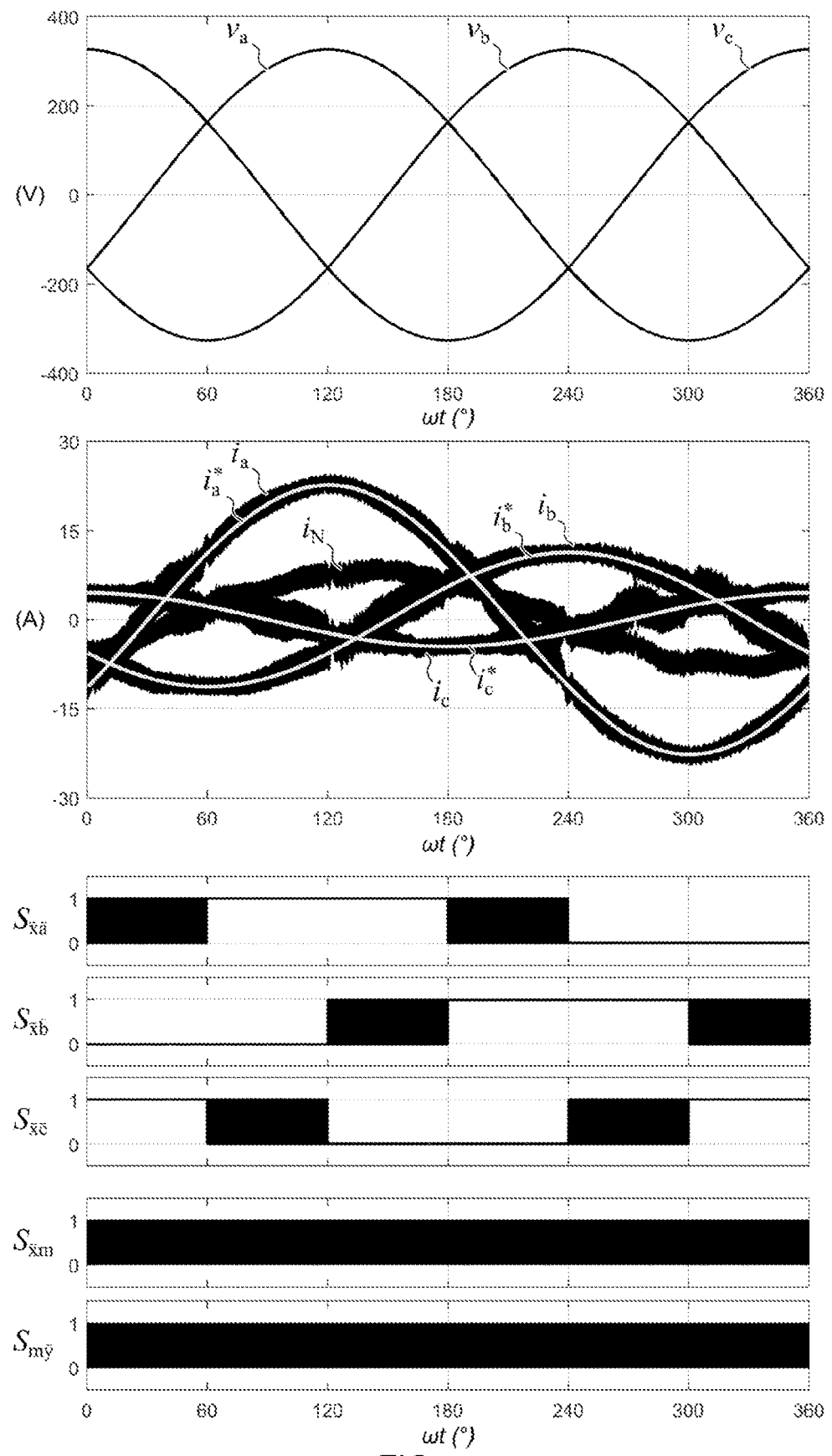
FIG. 6 shows diagrams with voltages, currents and switching states during a 360° period of the AC mains voltage, and illustrates the overall operating principle of the electrical converter according to an embodiment of the present disclosure.

FIG. 6 shows another example, similar to FIG. 2, in which the amplitudes of the phase-inductor currents $i_a$, $i_b$, $i_c$ are unequal, resulting in a non-zero average return current $i_N$ the is injected into the neutral conductor of the three-phase AC grid 20. This illustrated the ability of the electrical converter 10 and control unit 40 to independently control the amplitudes of the currents drawn from the phase inputs a,b,c of the three-phase AC grid 20.

Figure 7:
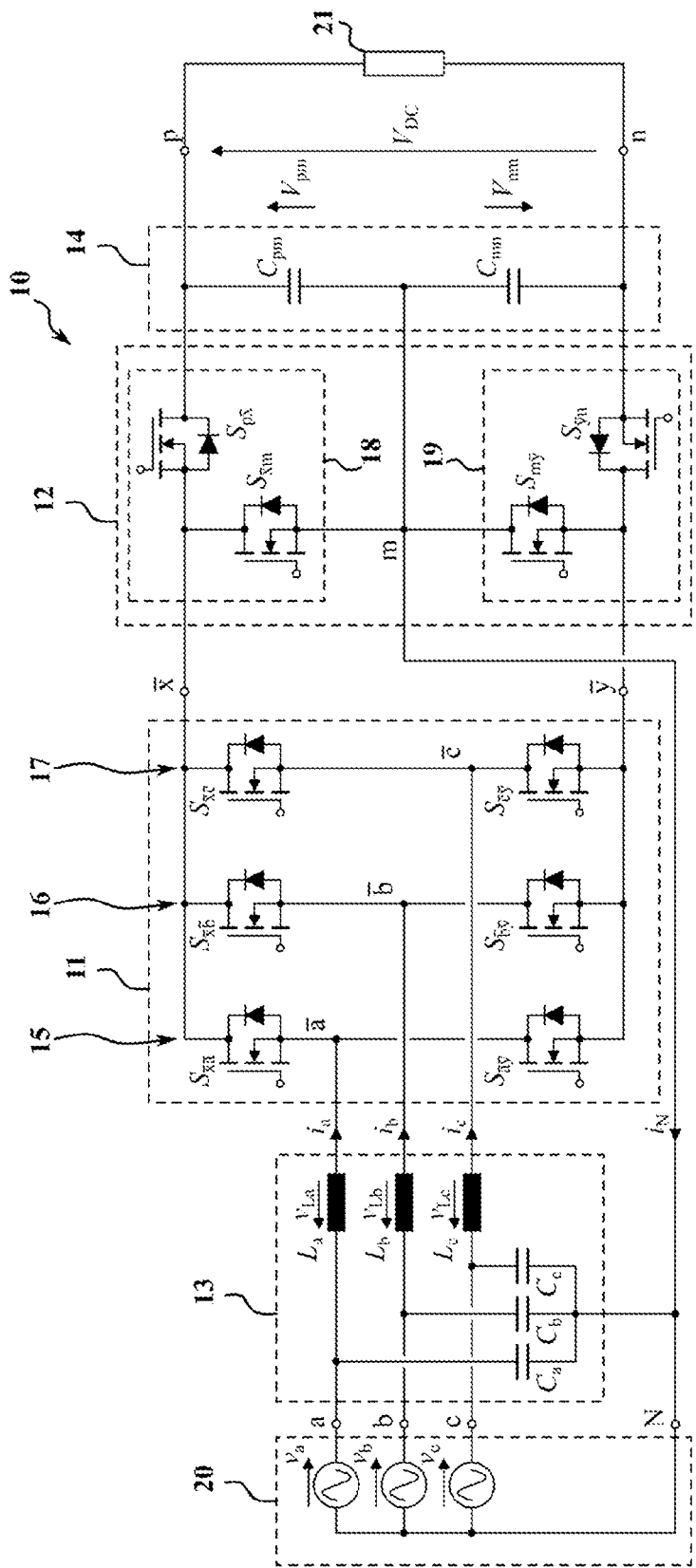
FIG. 7 schematically shows an electrical converter that has a neutral connection terminal and that is bidirectional according to an embodiment of the present disclosure.

The electrical converter shown in FIG. 1 is unidirectional since the output power stage 12 contains diodes, only allowing power to be drawn from the electrical AC grid 20 and provide this power at its output to a load 21. FIG. 7, on the other hand, shows an electrical converter 10 that is bidirectional, since the diodes of the output power stage 12 of the converter shown in FIG. 1 have been supplemented with controllable semiconductor switches $S_{p\overline{x}}$, $S_{\overline{y}n}$ connected between a respective upper or lower intermediate node $\overline{x},\overline{y}$ and a respective output terminal p, n.

Figure 8:
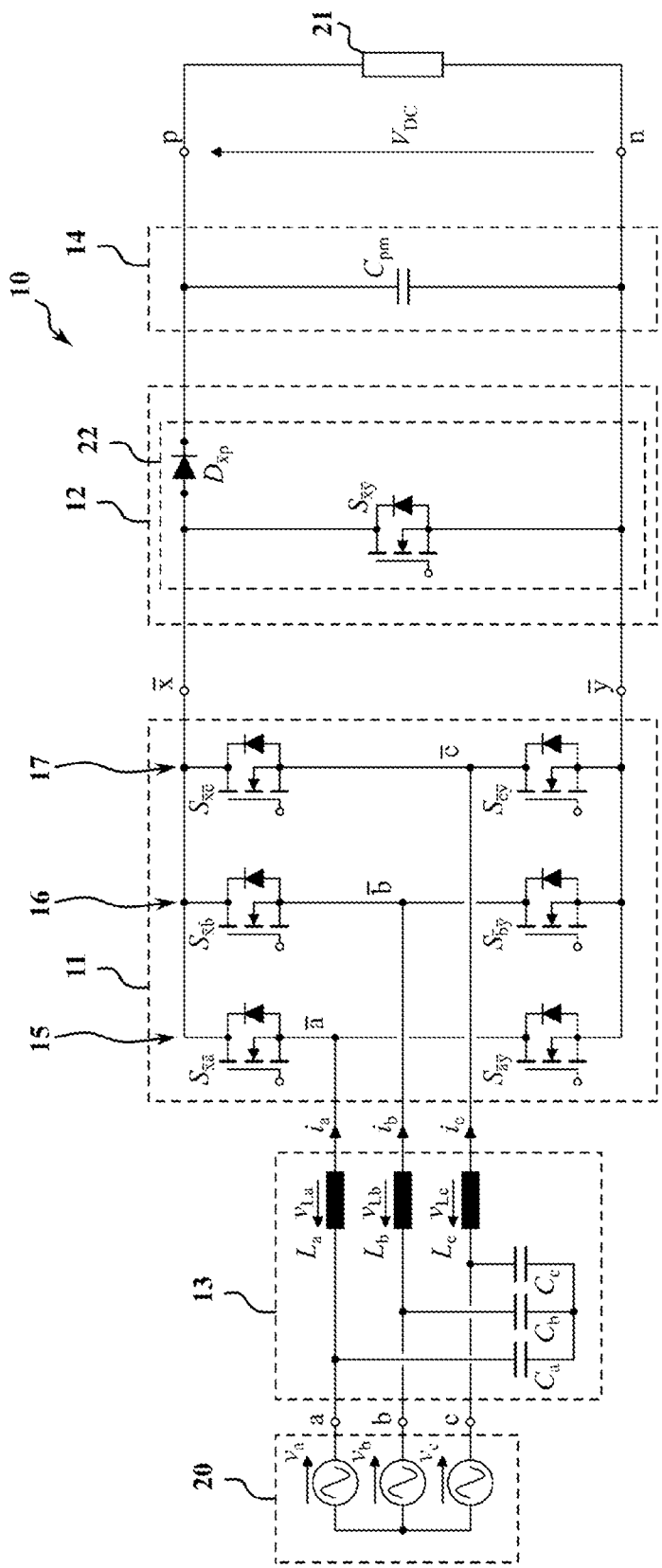
FIG. 8 schematically shows an electrical converter that has no neutral connection terminal, that is unidirectional, and that has an output power stage comprising one single bridge leg according to an embodiment of the present disclosure.

In FIG. 8, an electrical converter 10 without neutral connection terminal N is shown wherein the stacked boost bridges 18, 19 of the output power stage 12 are replaced by a single boost bridge 22. Boost bridge 22 comprises a controllable semiconductor switch $S_{\overline{xy}}$ connected between the upper and lower intermediate node $\overline{x},\overline{y}$. This converter does not provide a path for a return current equal to the sum of the three phase currents to flow back to the neutral conductor of the grid, and might be advantageous in case no neutral conductor of the electrical grid is present and/or in case the amplitudes of the three phase currents drawn from the three-phase AC grid do not need to be controlled fully independently, for example when it is sufficient to draw currents with substantially equal amplitudes.

Figure 9:
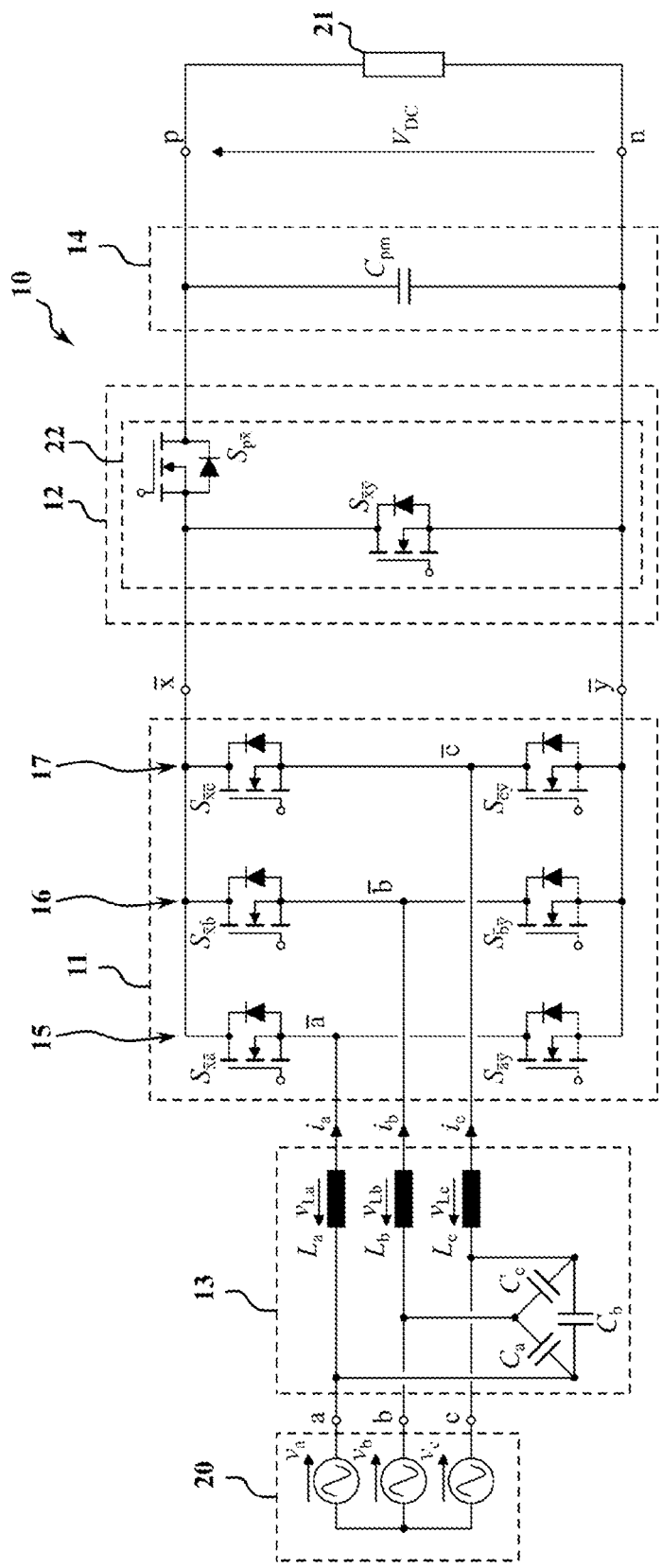
FIG. 9 schematically shows an electrical converter that has no neutral connection terminal, that is bidirectional, and that has an output power stage comprising one single bridge leg according to an embodiment of the present disclosure.

The electrical converter shown in FIG. 8 is unidirectional. The diode $D_{\overline{xp}}$ blocks bidirectional power flow. FIG. 9, on the other hand, shows an electrical converter that is bidirectional, since the diode $D_{\overline{xp}}$ of the output power stage 22 of the converter shown in FIG. 8 has been supplemented by a controllable semiconductor switch $S_{p\overline{x}}$.

Note that in FIG. 8 the AC capacitors $C_a$, $C_b$, $C_c$ of the electrical converter 10 are connected in a star configuration, while in FIG. 9 the AC capacitors $C_a$, $C_b$, $C_c$ are delta-connected. However, a delta connection is also possible in FIG. 8 or a star connection in FIG. 9.

Figure 10A:
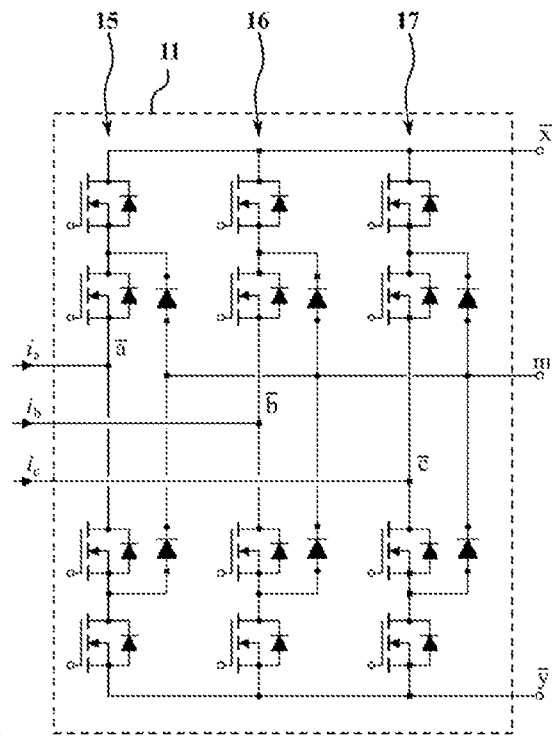
FIG. 10A shows a first variant of the rectifier power stage of the electrical converter, comprising bridge legs that are three-level half-bridges according to an embodiment of the present disclosure.
Figure 10B:
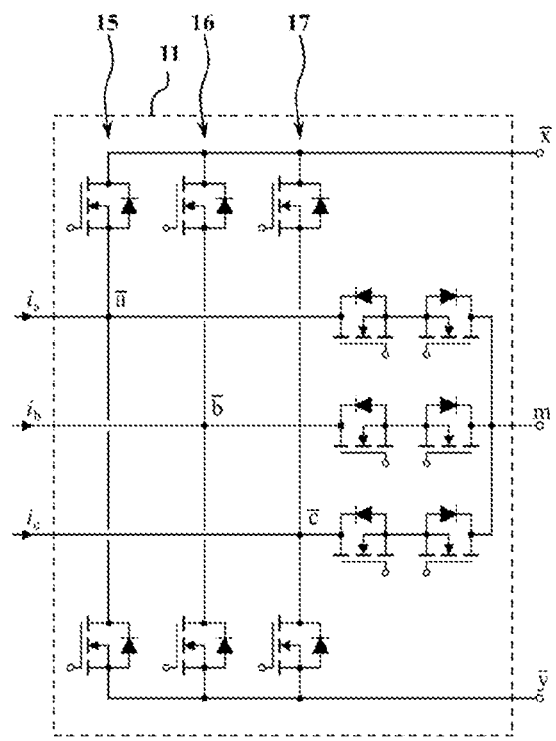
FIG. 10B shows a second variant of the rectifier power stage of the electrical converter, comprising bridge legs that are three-level half-bridges according to an embodiment of the present disclosure.

FIG. 10A, 10B show different variants of the three-phase active rectifier 11, which may be used in either FIG. 1, FIG. 7. In FIG. 10A and FIG. 10B the bridge legs are three-level half-bridges instead of two-level half bridges for FIG. 1 and FIG. 7. In the three-phase active rectifier 11 of FIG. 10A the half-bridges are NPC based (NPC stands for 'Neutral Point Clamped') while in the three-phase active rectifier 11 of FIG. 10B the half-bridges are T-type based. Note that in both FIG. 10A, 10B the three-level bridge legs comprise a connection to the middle output node m of the electrical converter 10.

The bridge leg of the rectifier stage in FIG. 10A, 10B that is connected with the phase input a, b, or c that has a voltage between the highest voltage and the lowest voltage of the three-phase AC input voltage may be switched in a way that the corresponding phase input a, b, or c is alternately connected to the upper intermediate voltage node $\overline{x}$, the lower intermediate voltage node $\overline{y}$, and the middle output node m via the corresponding phase inductor, wherein an additional voltage potential is applied to the phase inductor which may allow to further reduce the high-frequency ripple of the inductor current.

The invention claimed is:

1. An electrical converter for converting a three-phase AC input into a DC output, the electrical converter comprising:
   three phase input terminals and two output terminals;
   a three-phase bridge rectifier having an input side connected to the three phase input terminals and an output side connected to an upper intermediate output node and a lower intermediate output node, the three-phase bridge rectifier comprising first semiconductor switches;
   a boost circuit comprising boost inductors, at least one second semiconductor switch that is actively switchable, and at least one third semiconductor switch, wherein the at least one second semiconductor switch and the at least one third semiconductor switch are connected in series across the output terminals;
   an output filter comprising a filter capacitor connected between the boost circuit and the output terminals; and
   a controller operably connected to the at least one second semiconductor switch;
   wherein the boost inductors are connected between the three phase input terminals and the three-phase bridge rectifier;
   wherein the at least one second semiconductor switch is connected across the upper intermediate output node and the lower intermediate output node;
   wherein the controller is configured to control the at least one second semiconductor switch via pulse width modulation allowing for obtaining a pulsed intermediate voltage between the upper intermediate output node and the lower intermediate output node having a modulated pulse width;
   wherein the first semiconductor switches are actively switchable; and wherein the controller is operably connected to the first semiconductor switches to control switching of the first semiconductor switches according to a switching pattern in which one or more respective ones of the first semiconductor switches are operated via pulse width modulation, such that the phase input terminal having an intermediate voltage between a highest voltage and a lowest voltage is alternatingly connected to the upper intermediate output node and the lower intermediate output node.

2. The electrical converter of claim 1, wherein the electrical converter is free of energy storage elements between the three-phase bridge rectifier and the output filter.

3. The electrical converter of claim 1, comprising a measurement processing unit configured to measure phase currents through the boost inductors, and wherein the controller comprises a current control loop coupled to the measurement processing unit configured to measure the phase currents and to the at least one second semiconductor switch, wherein the current control loop is configured to generate a second pulse width modulation control signal fed to the at least one second semiconductor switch based on the phase currents measured.

4. The electrical converter of claim 1, wherein the switching pattern is such that:
the phase input terminal having a highest voltage is connected to the upper intermediate output node, and
the phase input terminal having a lowest voltage is connected to the lower intermediate output node.

5. The electrical converter of claim 4, wherein the switching pattern comprises:
the phase input terminal having a highest voltage is continuously connected to the upper intermediate output node, and
the phase input terminal having a lowest voltage is continuously connected to the lower intermediate output node.

6. The electrical converter of claim 4, further comprising:
a measurement processing unit configured to measure phase currents through the boost inductors, wherein the controller comprises a current control loop coupled to the measurement processing unit and to the at least one second semiconductor switch;
wherein the current control loop is configured to generate a second pulse width modulation control signal fed to the at least one second semiconductor switch based on the phase currents measured; and
wherein the current control loop is configured to generate a first pulse width modulation control signal fed to ones of the first semiconductor switches arranged to switch a phase connected to the phase input terminal having the intermediate voltage based on a respective one of the phase currents measured.

7. The electrical converter of claim 6, wherein the current control loop is configured to process the phase current measured in respect of the phase input terminal having the intermediate voltage to generate the first and second pulse width modulation control signals.

8. The electrical converter of claim 6, wherein the first and second pulse width modulation control signals are interleaved.

9. The electrical converter of claim 1, wherein the pulsed intermediate voltage is a square wave signal comprising at least two voltage levels, one of the at least two voltage levels being substantially 0 V.

10. The electrical converter of claim 1, comprising a neutral connection terminal for connecting a neutral conductor of the three-phase AC input, wherein the boost circuit comprises a common node, an upper boost bridge comprising a first one of the at least one second semiconductor switch connected across the upper intermediate output node and the common node, and a lower boost bridge comprising a second one of the at least one second semiconductor switch connected across the common node and the lower intermediate output node, wherein the common node is connected to the neutral connection terminal and to a midpoint of the output filter.

11. The electrical converter of claim 10, wherein the controller is configured to generate interleaved pulse width modulation control signals applied to the first one and to the second one of the at least one second semiconductor switch.

12. The electrical converter of claim 1, comprising a second measurement processing unit configured to measure voltages at the three phase input terminals and a third measurement processing unit configured to measure a voltage at the output terminals, both being coupled to the controller.

13. The electrical converter of claim 1, wherein the at least one third semiconductor switch, is actively switchable, wherein the at least one third semiconductor switch is arranged to allow for bidirectional power flow.

14. A method of converting a three-phase AC input into a DC output in an electrical boost converter, the method comprising:
rectifying the three-phase AC input to obtain a rectified intermediate signal across an upper intermediate output node and a lower intermediate output node;
connecting a phase of the three-phase AC input having an intermediate voltage between a highest voltage and a lowest voltage of the three-phase AC input alternatingly to the upper intermediate output node and the lower intermediate output node by switching of at least one first semiconductor switch via pulse width modulation;
boosting the rectified intermediate voltage to obtain the DC output across an output filter comprising a filter capacitor, wherein boosting the rectified intermediate voltage comprises controlled switching of the rectified intermediate voltage signal through at least one second semiconductor switch via impulse width modulation to obtain a pulsed voltage signal; and
applying the pulsed voltage signal across the output filter;
wherein boost energy is stored in boost inductors connected to the three-phase AC input prior to rectifying.

15. The method of claim 14, wherein rectifying the three-phase AC input comprises
measuring the three-phase AC input and determining a first phase having a highest voltage, a second phase having a lowest voltage, and a third phase having the intermediate voltage between the highest voltage and the lowest voltage,
continuously applying the first phase to the upper intermediate output node, and
continuously applying the second phase to the lower intermediate output node.

16. The method of claim 14, wherein a current through the boost inductors is measured and controlled via adapting a pulse width modulation control signal applied in the controlled switching step.

17. The method of claim 14, wherein no energy is stored between the rectifying and controlled switching steps.

18. The method of claim 14, wherein the pulsed voltage is a square wave signal comprising at least two voltage levels, one of the at least two voltage levels being substantially 0 V.

19. An electrical converter for converting a three-phase AC input into a DC output, the electrical converter comprising:

three phase input terminals and two output terminals;

a three-phase bridge rectifier having an input side connected to the three phase input terminals and an output side connected to an upper intermediate output node and a lower intermediate output node, the three-phase bridge rectifier comprising first semiconductor switches;

a boost circuit comprising boost inductors, at least one second semiconductor switch that is actively switchable, and at least one third semiconductor switch, wherein the at least one second semiconductor switch and the at least one third semiconductor switch are connected in series across the output terminals;

an output filter comprising a filter capacitor connected between the boost circuit and the output terminals;

a controller operably connected to the at least one second semiconductor switch;

a neutral connection terminal for connecting a neutral conductor of the three-phase AC input, wherein the boost circuit comprises a common node;

an upper boost bridge comprising a first one-of the at least one second semiconductor switch connected across the upper intermediate output node and the common node; and a lower boost bridge comprising a second one of the at least one second semiconductor switch connected across the common node and the lower intermediate output node, wherein the common node is connected to the neutral connection terminal and to a midpoint of the output filter;

wherein the boost inductors are connected between the three phase input terminals and the three-phase bridge rectifier, wherein the at least one second semiconductor switch is connected across the upper intermediate output node and the lower intermediate output node, and wherein the controller is configured to control the at least one second semiconductor switch via pulse width modulation allowing for obtaining a pulsed intermediate voltage between the upper intermediate output node and the lower intermediate output node having a modulated pulse width;

wherein the first semiconductor switches are actively switchable; and wherein the controller is operably connected to the first semiconductor switches to control switching of the first semiconductor switches according to a switching pattern wherein the phase input terminal having an intermediate voltage between a highest voltage and a lowest voltage is alternatingly connected to the upper intermediate output node and the lower intermediate output node.

* * * * *

UNITED STATES PATENT AND TRADEMARK OFFICE
CERTIFICATE OF CORRECTION

| | | |
|---|---|---|
| PATENT NO. | : 11,916,474 B2 | Page 1 of 1 |
| APPLICATION NO. | : 17/268773 | |
| DATED | : February 27, 2024 | |
| INVENTOR(S) | : Jordi Everts | |

It is certified that error appears in the above-identified patent and that said Letters Patent is hereby corrected as shown below:

In the Claims

Column 18, Line 45, Claim 14, the text "via impulse width modulation" should read --via pulse width modulation--.

Signed and Sealed this
Second Day of April, 2024

Katherine Kelly Vidal
*Director of the United States Patent and Trademark Office*